US 11,895,834 B2

(12) United States Patent
Chen et al.

(10) Patent No.: US 11,895,834 B2
(45) Date of Patent: Feb. 6, 2024

(54) METHODS USED IN FORMING A MEMORY ARRAY COMPRISING STRINGS OF MEMORY CELLS

(71) Applicant: Micron Technology, Inc., Boise, ID (US)

(72) Inventors: Jiewei Chen, Meridian, ID (US); Jordan D. Greenlee, Boise, ID (US); Mithun Kumar Ramasahayam, Meridian, ID (US); Nancy M. Lomeli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 17/674,478

(22) Filed: Feb. 17, 2022

(65) Prior Publication Data

US 2023/0209818 A1    Jun. 29, 2023

Related U.S. Application Data

(60) Provisional application No. 63/294,219, filed on Dec. 28, 2021.

(51) Int. Cl.
*H10B 41/10* (2023.01)
*G11C 16/04* (2006.01)
(Continued)

(52) U.S. Cl.
CPC ......... *H10B 41/10* (2023.02); *G11C 16/0483* (2013.01); *H10B 41/27* (2023.02); *H10B 43/10* (2023.02); *H10B 43/27* (2023.02); *H10B 41/35* (2023.02); *H10B 43/35* (2023.02)

(58) Field of Classification Search
CPC ........ H10B 41/10; H10B 41/27; H10B 43/10; H10B 43/27; H10B 41/35; H10B 43/35; G11C 16/0483
(Continued)

(56) References Cited

U.S. PATENT DOCUMENTS 10,236,301 B1     3/2019  Howder et al.
11,362,142 B2 *   6/2022  Hu ......................... H10B 43/35
(Continued)

OTHER PUBLICATIONS

U.S. Appl. No. 17/689,527, filed Mar. 8, 2022, by Greenlee et al.
(Continued)

*Primary Examiner* — Fernando Hidalgo
(74) *Attorney, Agent, or Firm* — Wells St. John P.S.

(57) ABSTRACT

A method used in forming a memory array comprising strings of memory cells comprises forming memory blocks individually comprising a vertical stack comprising alternating insulative tiers and conductive tiers. Channel-material strings extend through the insulative tiers and the conductive tiers. Horizontally-elongated trenches are between immediately-laterally-adjacent of the memory blocks. Conductor material is in and extends elevationally along sidewalls of the trenches laterally-over the conductive tiers and the insulative tiers and directly electrically couples together conducting material of individual of the conductive tiers. The conductor material is exposed to oxidizing conditions to form an insulative oxide laterally-through the conductor material laterally-over individual of the insulative tiers to separate the conducting material of the individual conductive tiers from being directly electrically coupled together by the conductor material. Additional embodiments are disclosed.

25 Claims, 15 Drawing Sheets

(51) Int. Cl.
  *H10B 41/27*  (2023.01)
  *H10B 43/10*  (2023.01)
  *H10B 43/27*  (2023.01)
  *H10B 41/35*  (2023.01)
  *H10B 43/35*  (2023.01)

(58) Field of Classification Search
  USPC .................................................. 365/185.11
  See application file for complete search history.

(56) References Cited

U.S. PATENT DOCUMENTS

| | | | |
|---|---|---|---|
| 2016/0218059 A1* | 7/2016 | Nakada | H10B 41/27 |
| 2020/0083059 A1 | 3/2020 | Hopkins et al. | |
| 2020/0343258 A1* | 10/2020 | Otsu | H10B 41/35 |
| 2021/0280595 A1 | 9/2021 | Hopkins et al. | |
| 2021/0280691 A1 | 9/2021 | Hopkins | |
| 2022/0270967 A1* | 8/2022 | Hosoda | H10B 41/10 |
| 2023/0005942 A1* | 1/2023 | Hwang | H10B 43/27 |
| 2023/0157023 A1* | 5/2023 | Son | H10B 43/10 |
| | | | 257/314 |
| 2023/0290721 A1* | 9/2023 | Greenlee | H01L 23/53271 |
| | | | 257/314 |

OTHER PUBLICATIONS

Greenlee et al., U.S. Appl. No. 17/851,865, filed Jun. 28, 2022, titled "Memory Arrays Comprising Strings of Memory Cells and Methods Used in Forming a Memory Array Comprising Strings of Memory Cells", 35 pages.

* cited by examiner

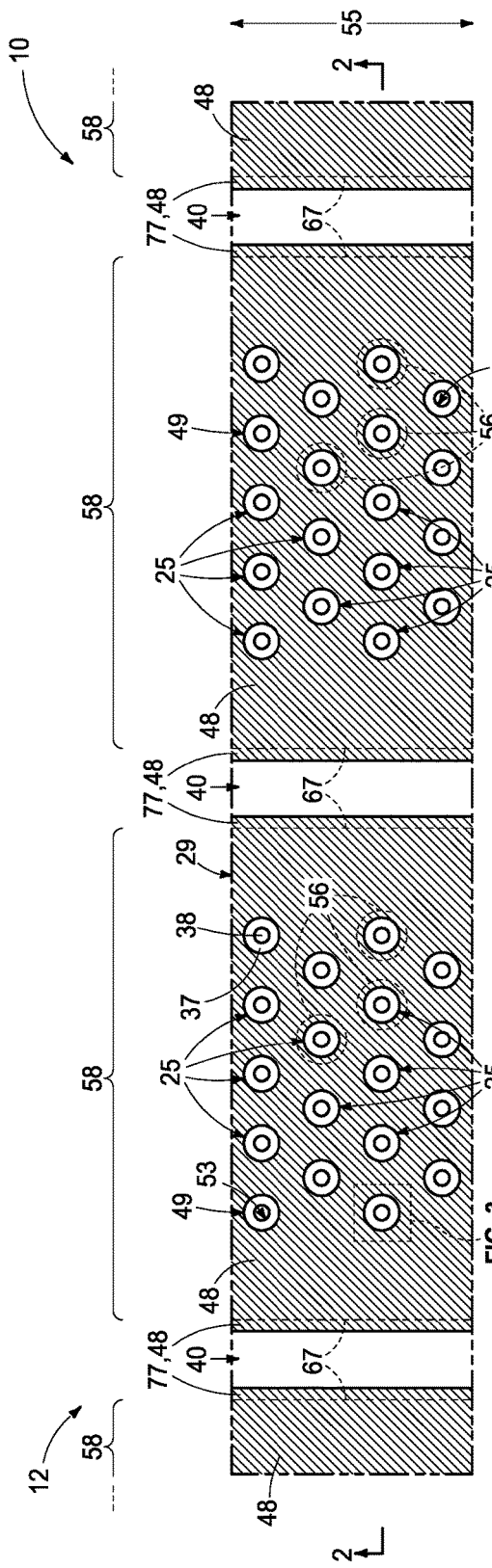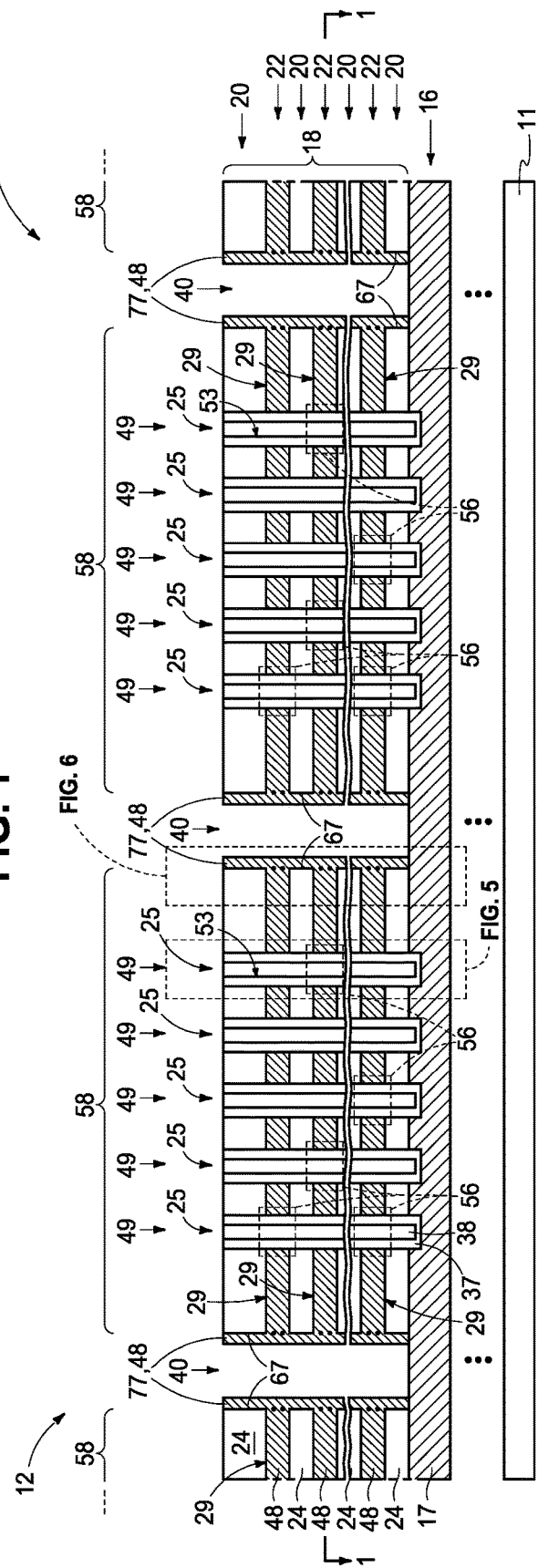

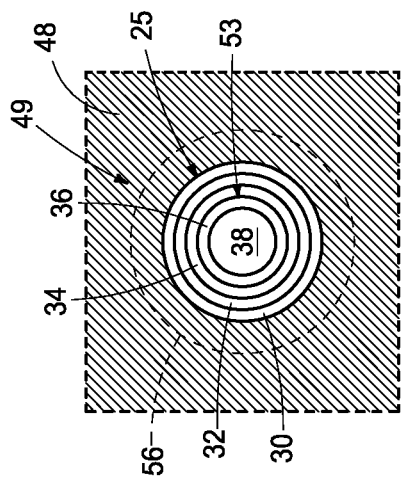
FIG. 3
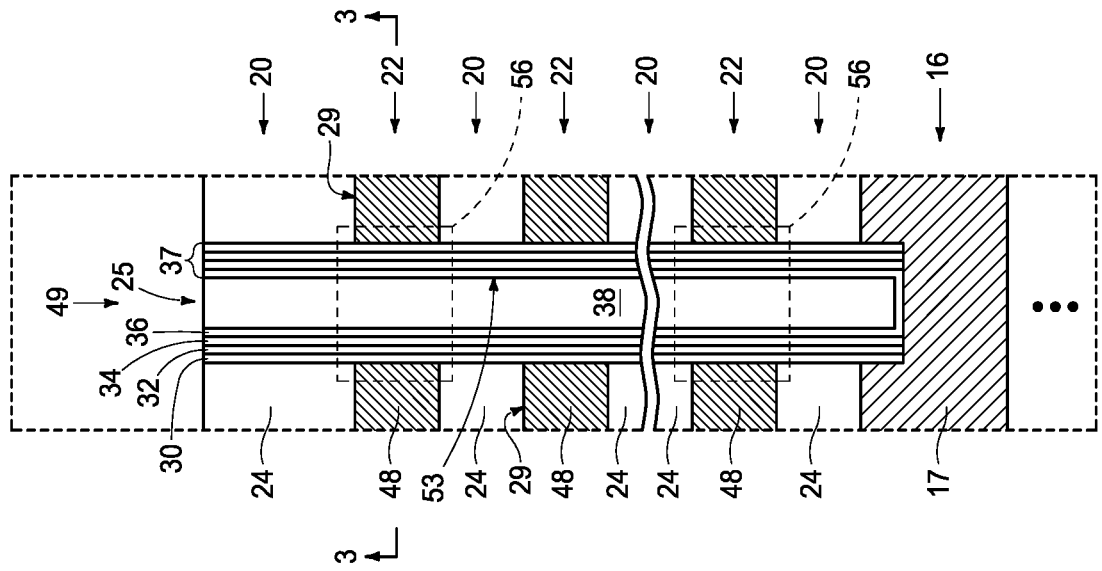
FIG. 4
FIG. 5

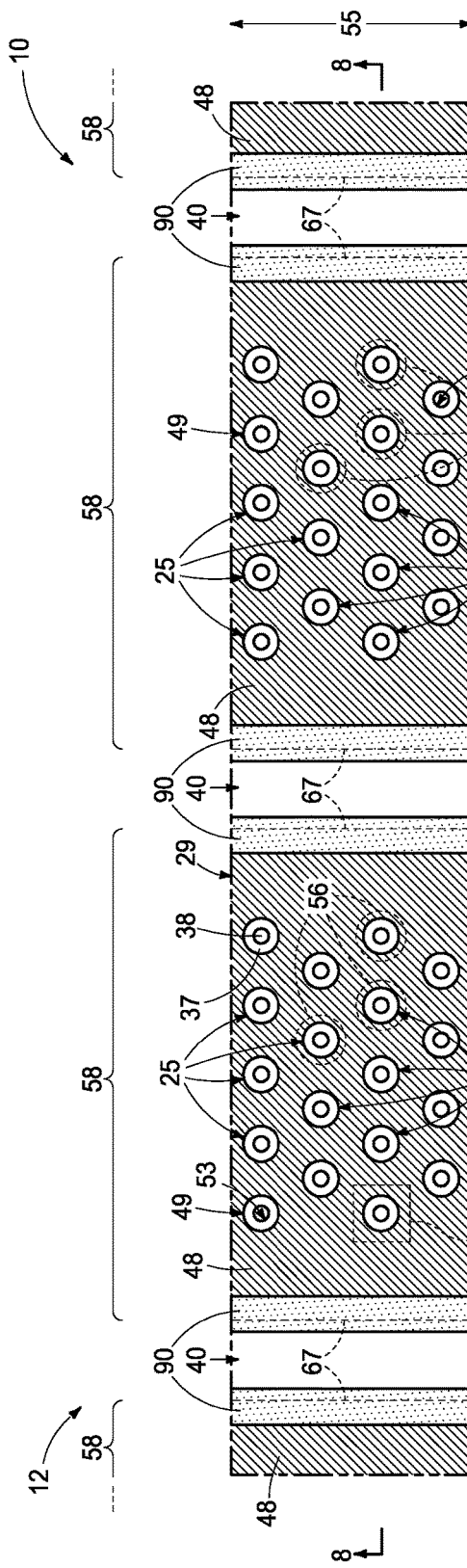
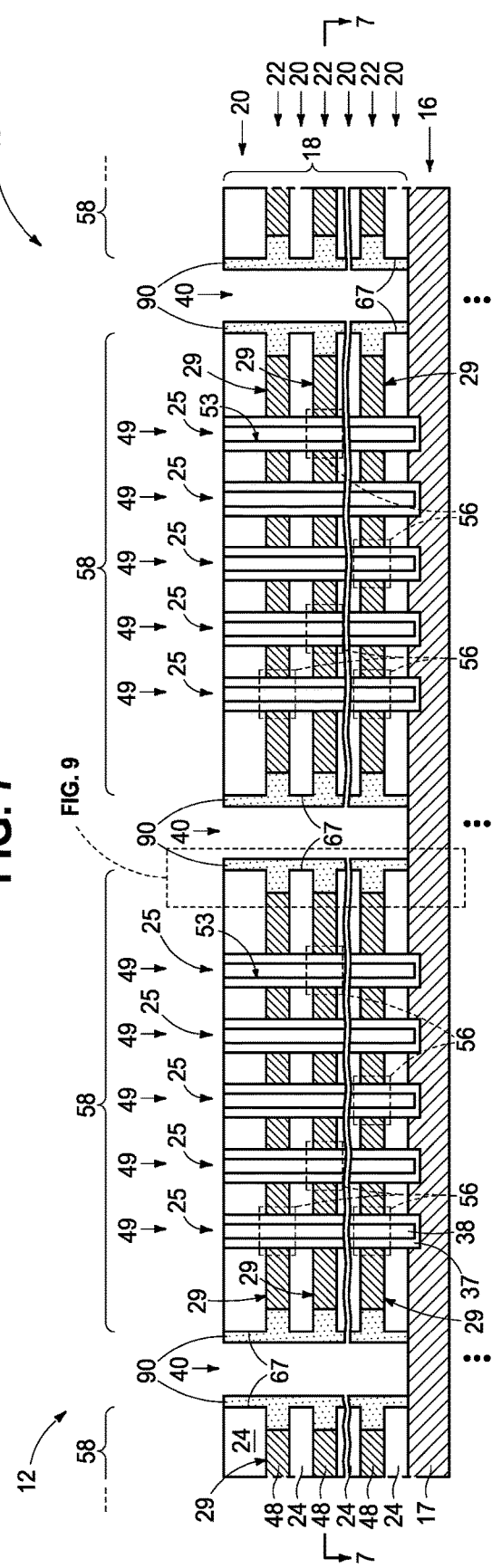
FIG. 7
FIG. 3
FIG. 9
FIG. 8

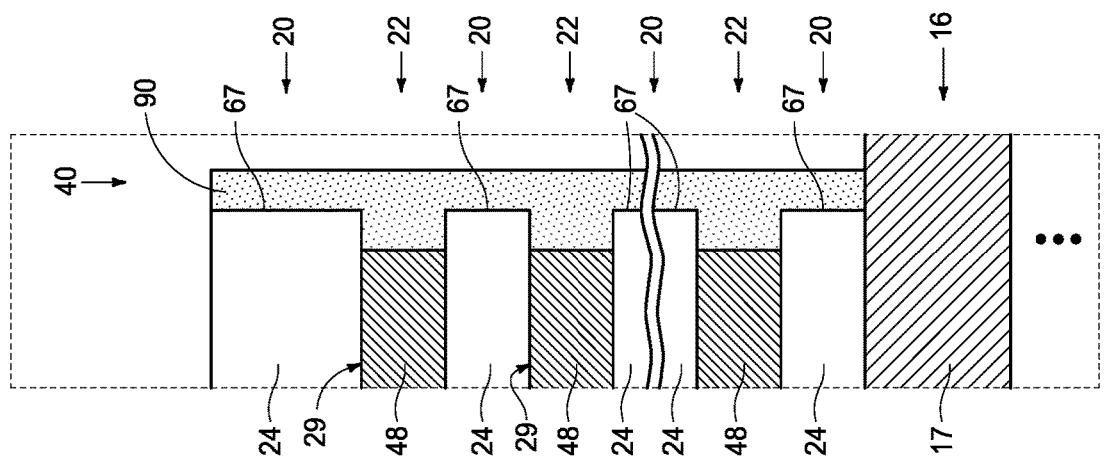

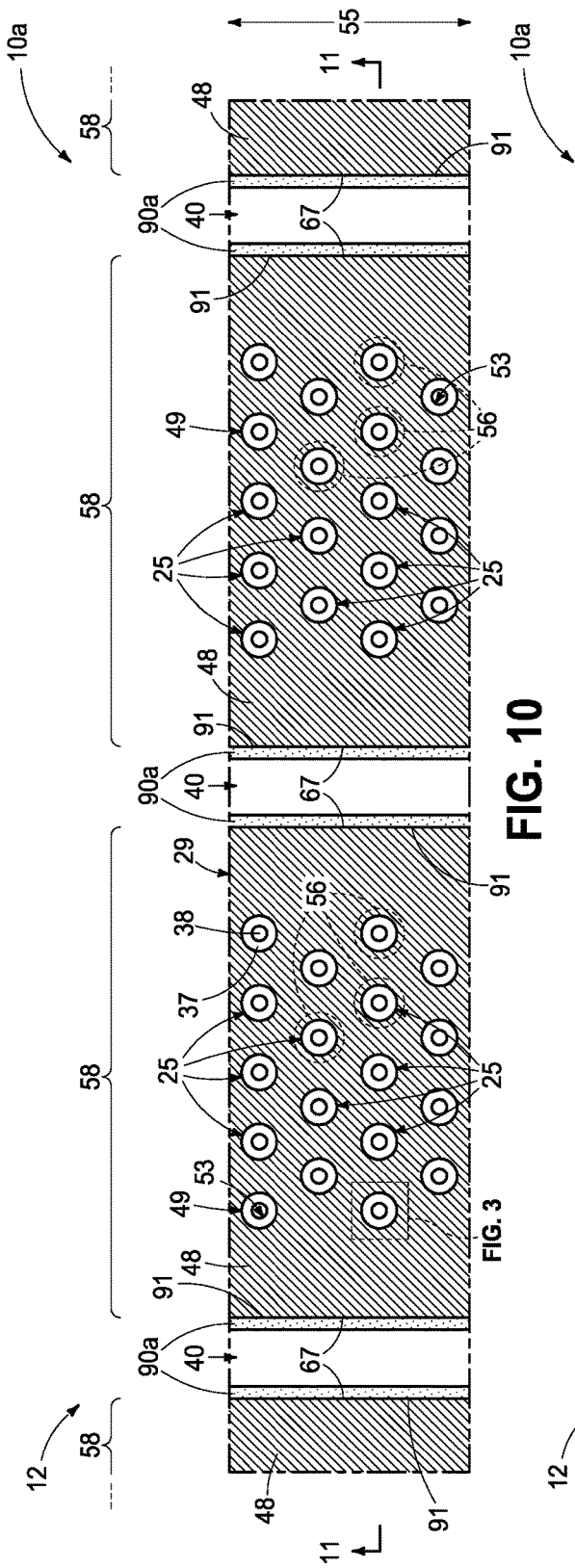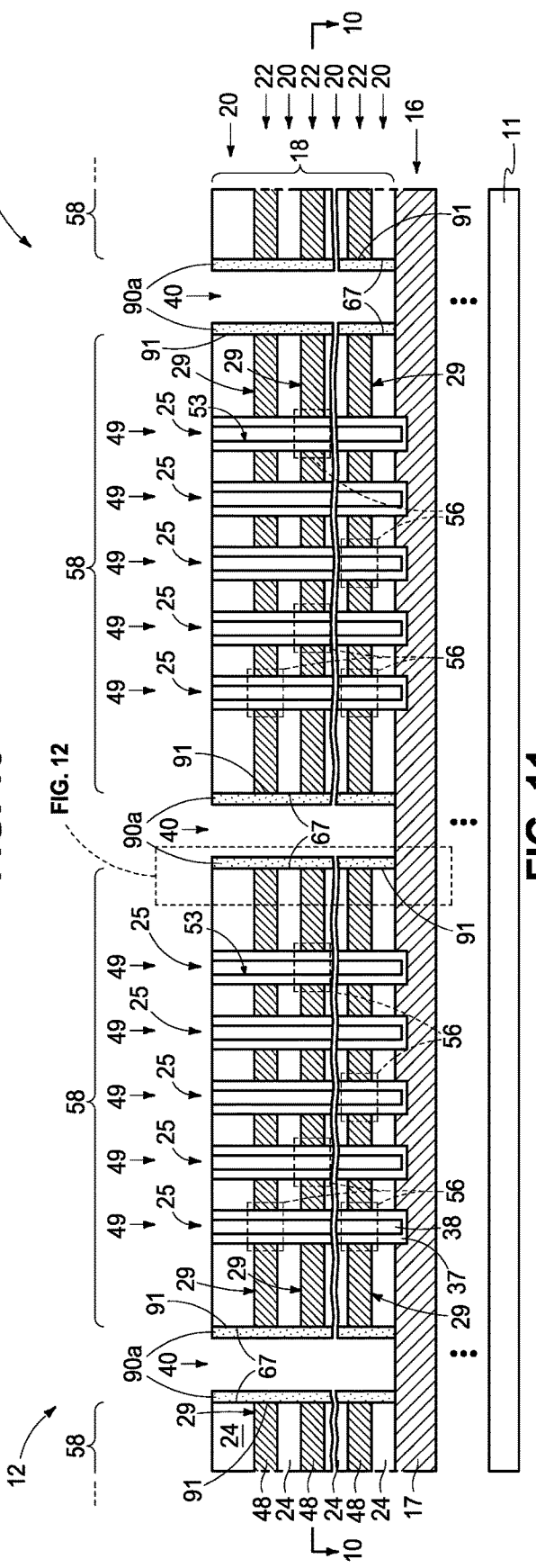

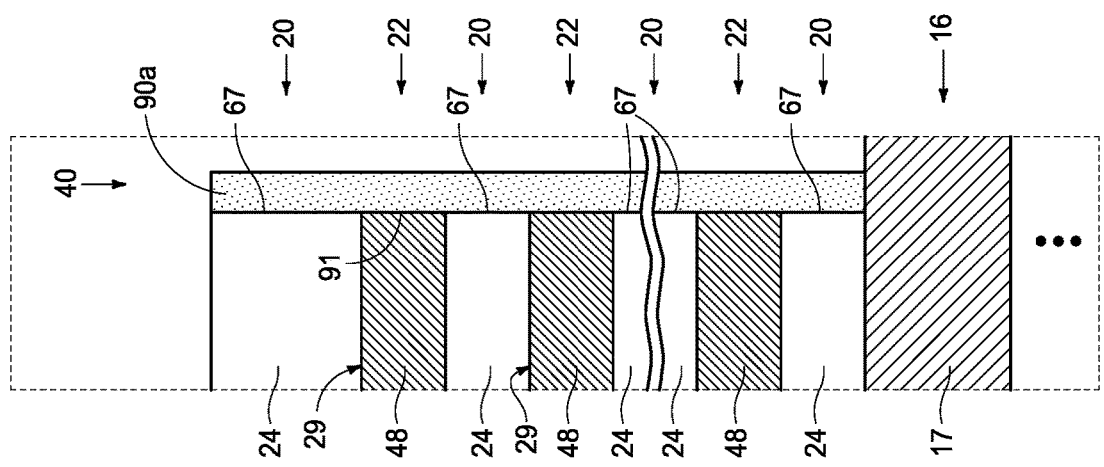

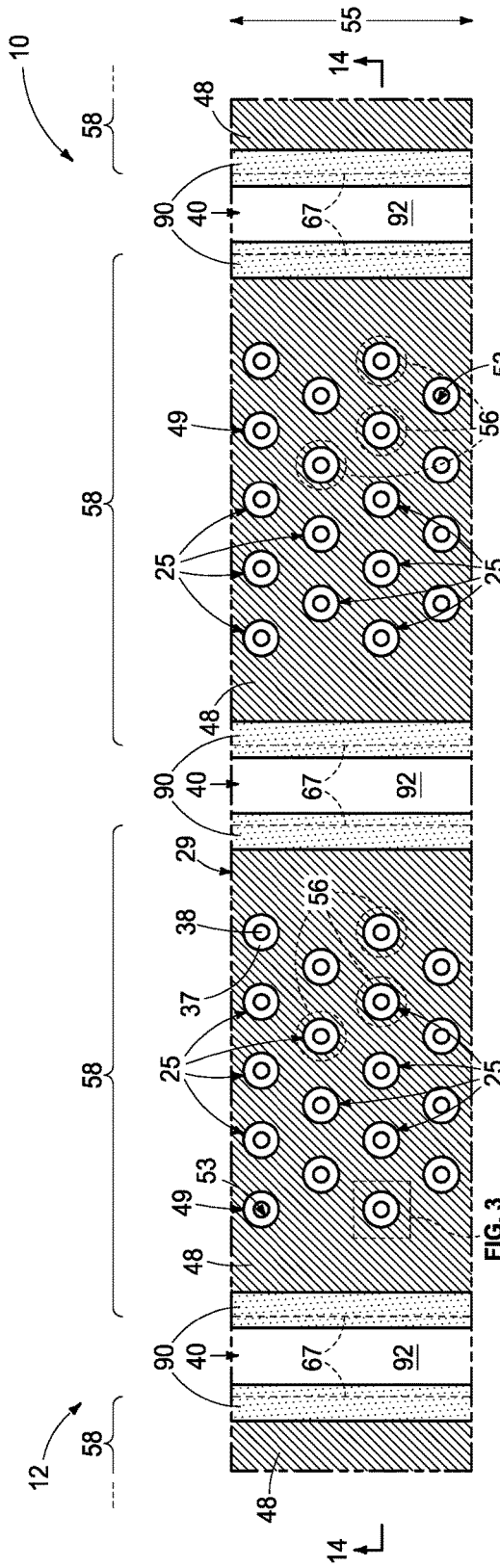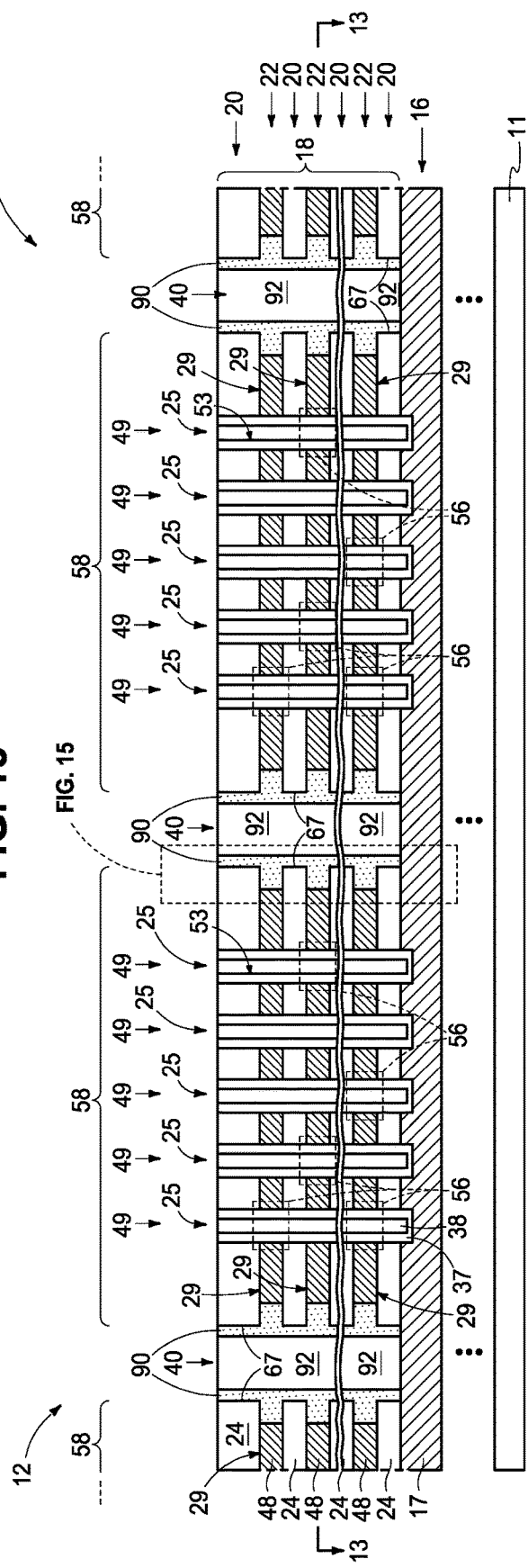

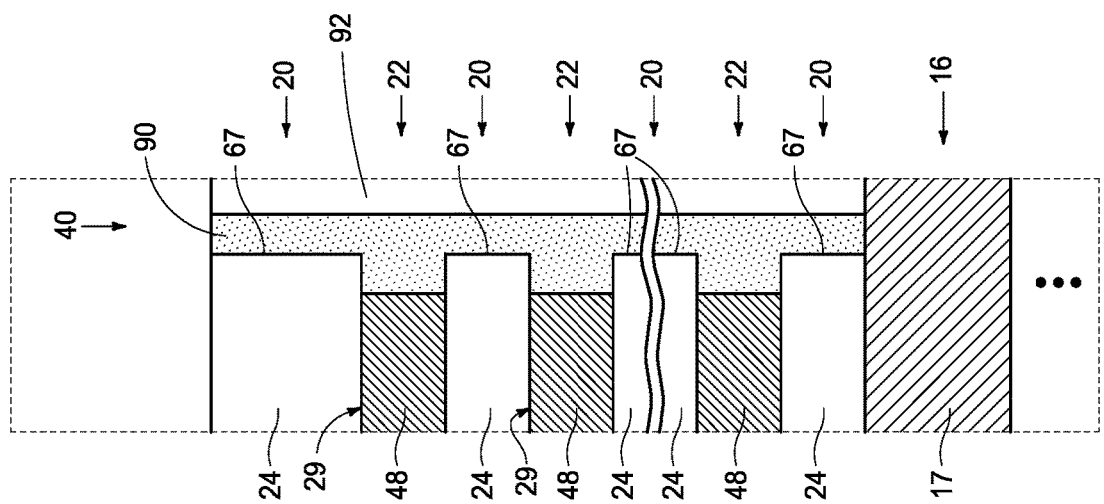

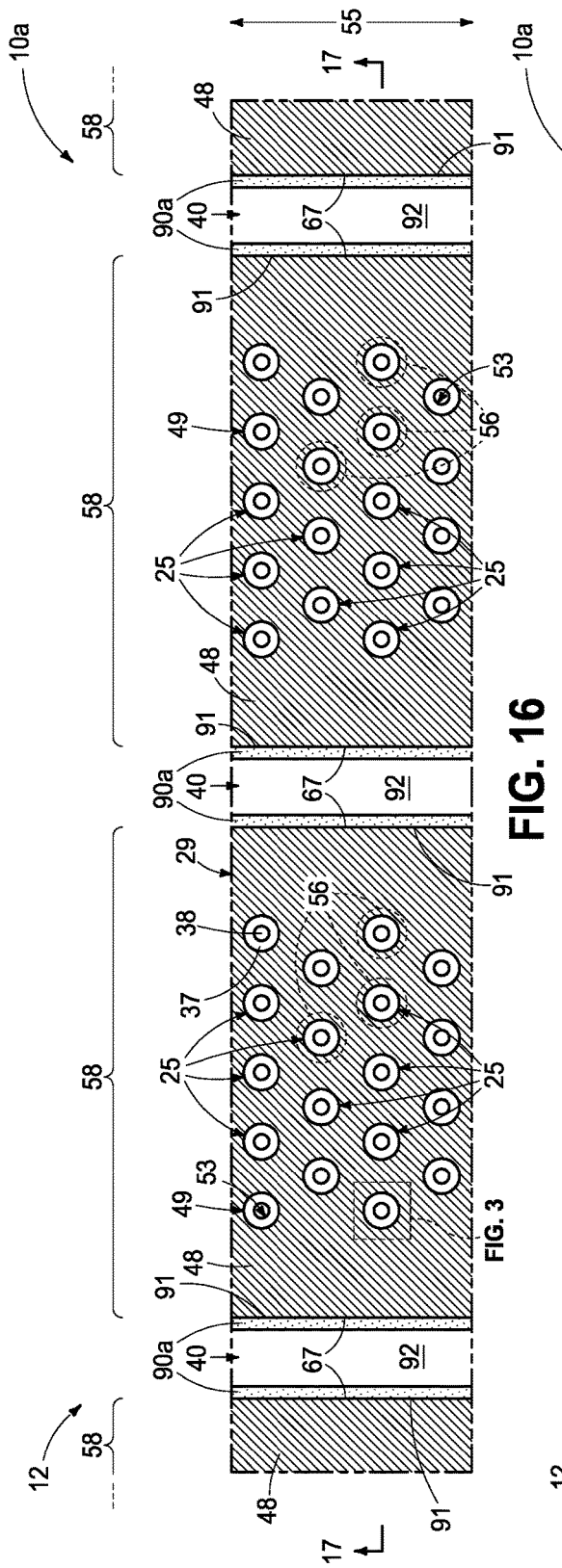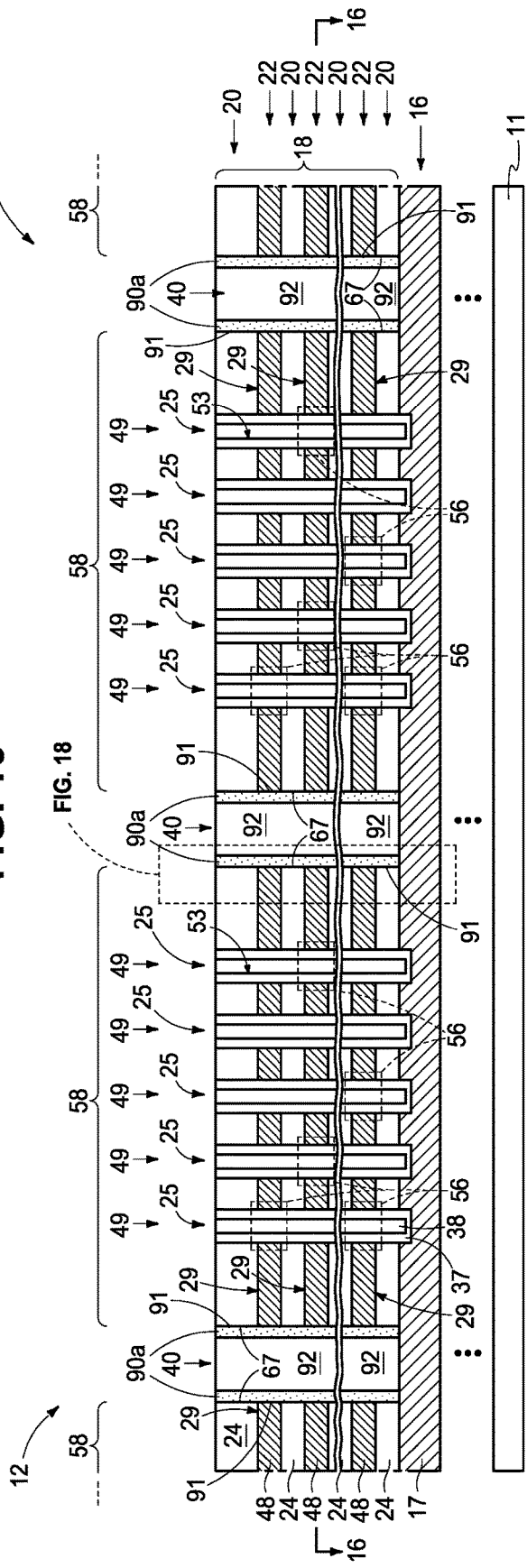

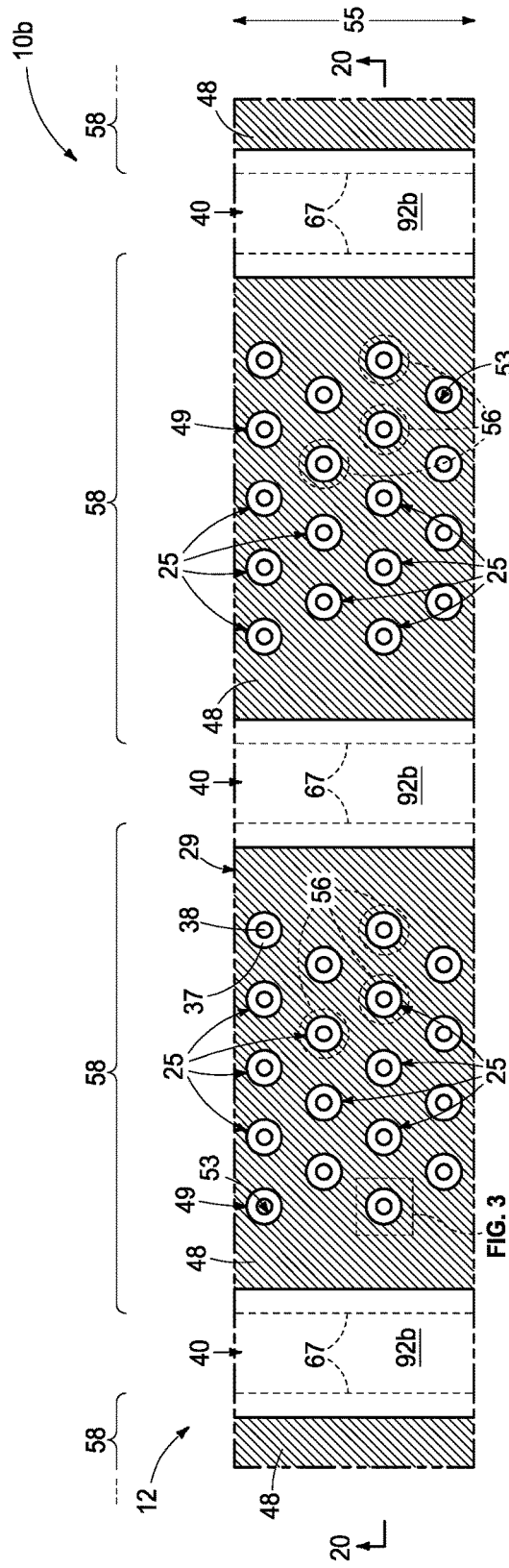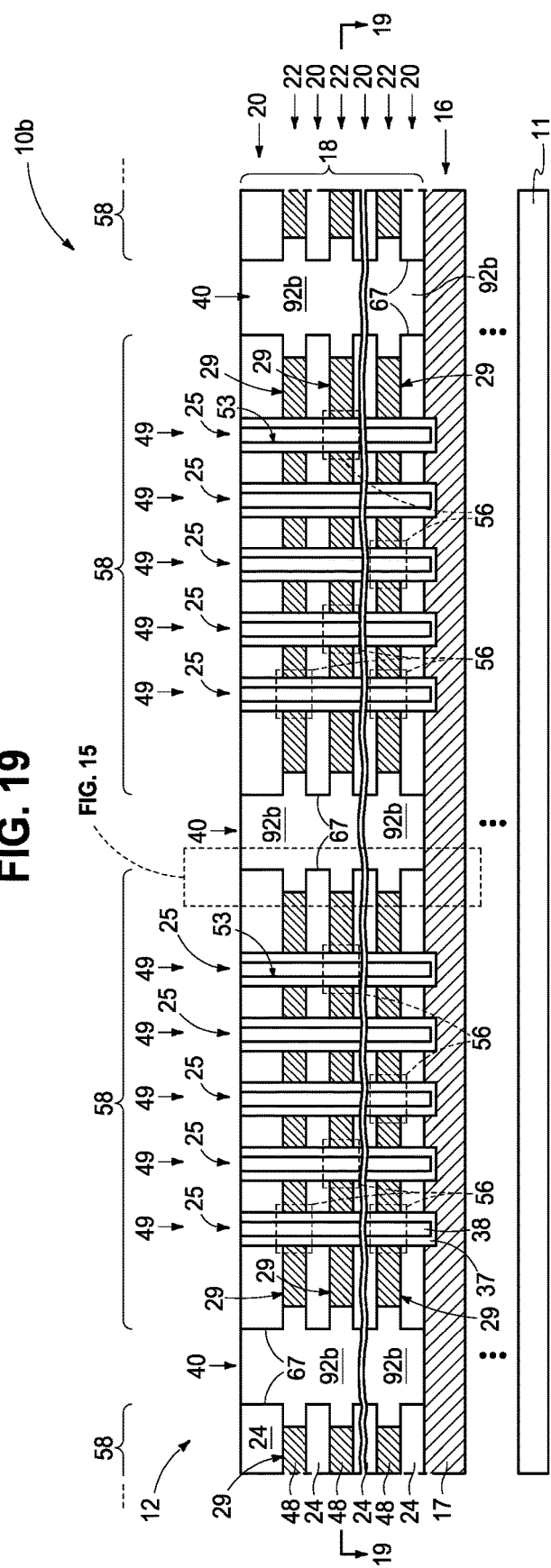

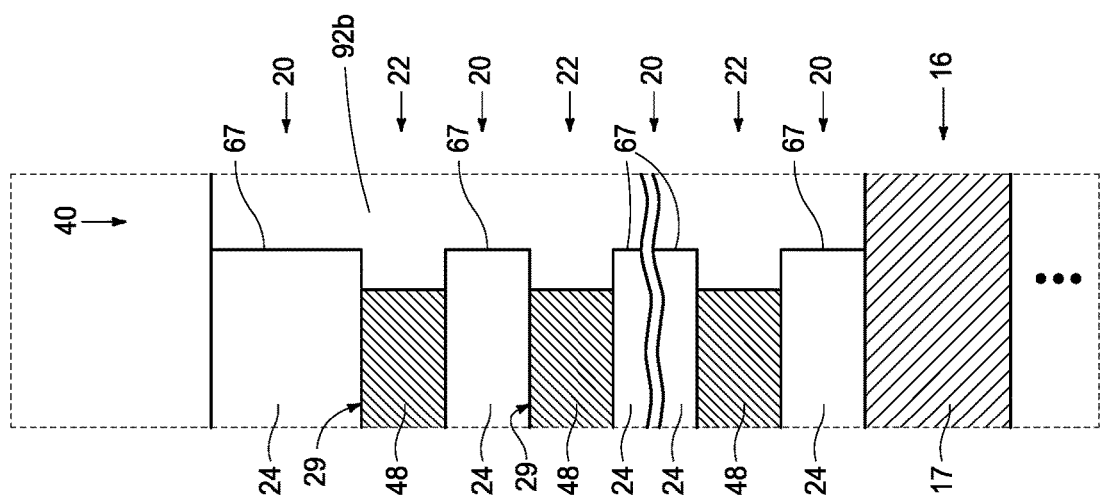

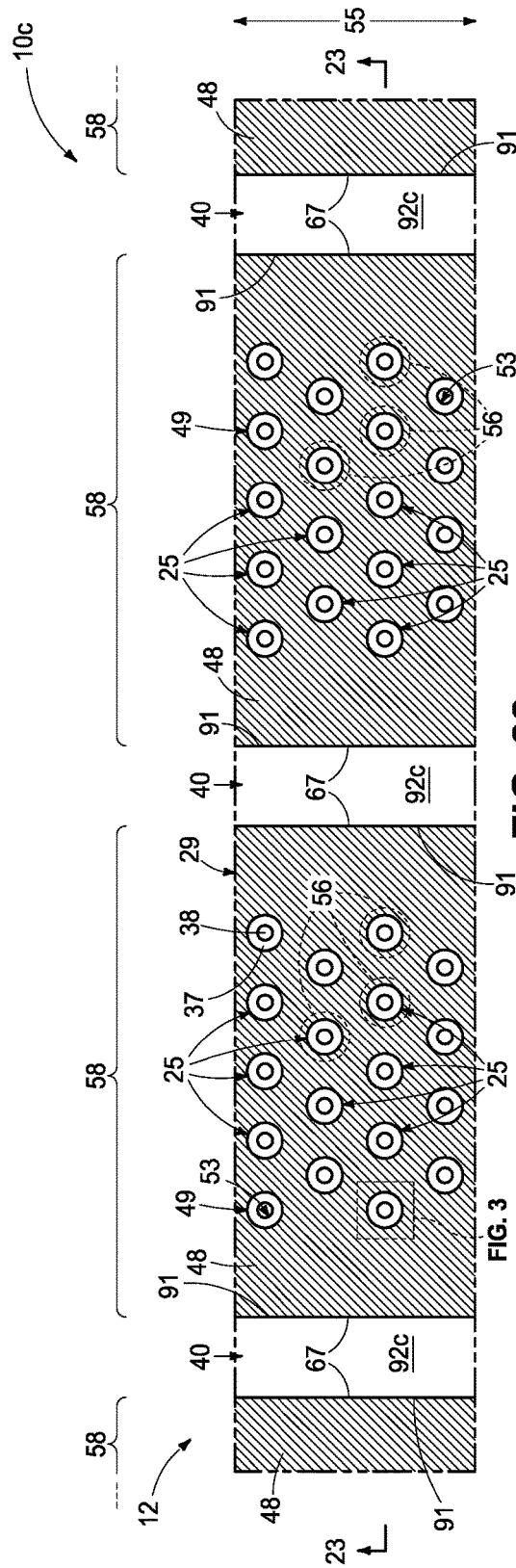
FIG. 22
FIG. 3
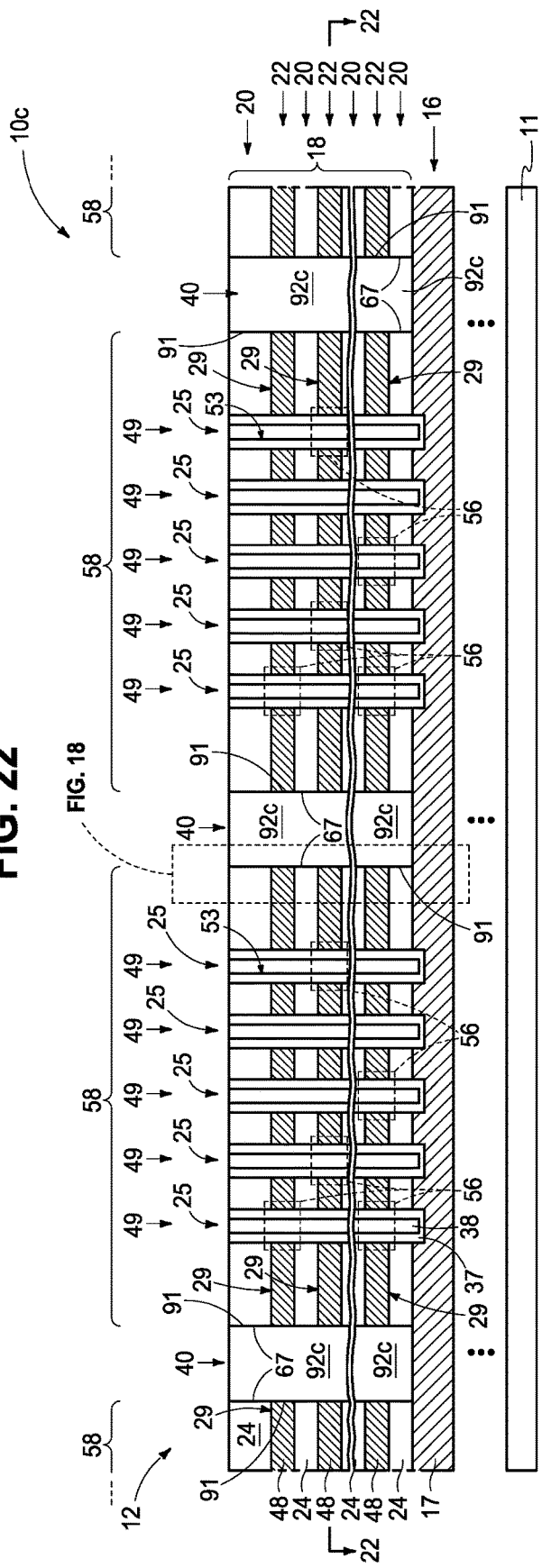
FIG. 23
FIG. 18

METHODS USED IN FORMING A MEMORY ARRAY COMPRISING STRINGS OF MEMORY CELLS

TECHNICAL FIELD

Embodiments disclosed herein pertain to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIGS. 1-6 are diagrammatic cross-sectional views of portions of a construction in a method used in forming a memory array comprising strings of memory cells in accordance with some embodiments of the invention.

FIGS. 7-24 are diagrammatic sequential sectional and/or enlarged views of the construction of FIGS. 1-6, or portions thereof or alternate and/or additional embodiments, in process in accordance with some embodiments of the invention.

DETAILED DESCRIPTION OF EXAMPLE EMBODIMENTS

Figure 6:
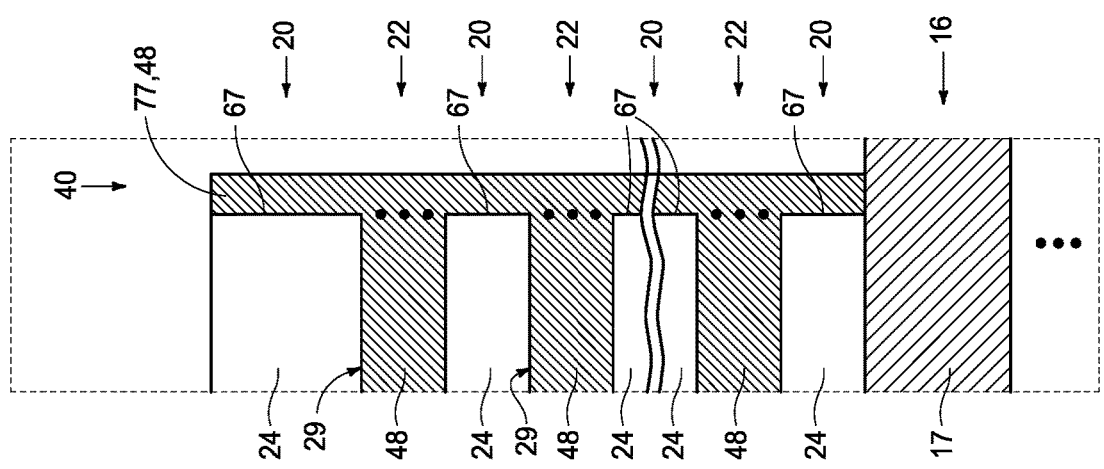

Embodiments of the invention encompass methods used in forming a memory array, for example an array of NAND or other memory cells having peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Example embodiments are described with reference to FIGS. 1-24.

Referring to FIGS. 1-6, a construction 10 is shown in a method used in forming a memory array 12 of elevationally-extending strings of transistors and/or memory cells. Example construction 10 comprises a base substrate 11 comprising conductive/conductor/conducting, semiconductive/semiconductor/semiconducting, and/or insulative/insulator/insulating (i.e., electrically herein) materials. Various materials have been formed elevationally over base substrate 11. Materials may be aside, elevationally inward, or elevationally outward of the FIGS. 1-6-depicted materials. For example, other partially or wholly fabricated components of integrated circuitry may be provided somewhere above, about, or within base substrate 11. Control and/or other peripheral circuitry for operating components within an array (e.g., memory array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 (e.g., WSi$_x$ atop conductively-doped polysilicon) is above substrate 11. Conductor tier 16 may comprise part of control circuitry (e.g., peripheral-under-array circuitry and/or a common source line or plate) used to control read and write access to the transistors and/or memory cells in array 12. A vertical stack 18 comprising vertically-alternating insulative tiers 20 and conductive tiers 22 is directly above conductor tier 16. In some embodiments, conductive tiers 22 may be referred to as first tiers 22 and insulative tiers 20 are referred to as second tiers 20. Example thickness for each of tiers 20 and 22 is 20 to 60 nanometers. The example uppermost tier 20 may be thicker/thickest compared to one or more other tiers 20 and/or 22. Only a small number of tiers 20 and 22 is shown in FIGS. 1-6, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a first direction 55. Any alternate existing or future-developed arrangement and construction may be used.

Example memory blocks 58 are shown as at least in part having been defined by horizontally-elongated trenches 40 that were formed (e.g., by anisotropic etching) into stack 18 (e.g., trenches 40 being between immediately-laterally-adjacent memory blocks 58). Trenches 40 will typically be wider than channel openings 25 (e.g., 3 to 10 times wider). Trenches 40 may have respective bottoms that are directly against conductor material 17 (e.g., atop or within) of conductor tier 16 (as shown) or may have respective bottoms that are above conductor material 17 of conductor tier 16 (not shown). Trenches 40 may taper laterally inward and/or outward in vertical cross-section (not shown). Trenches 40 may be considered as comprising sidewalls 67 (e.g., comprising and/or defined by sidewalls of insulative material 24).

Transistor channel material may be formed in the individual channel openings elevationally along the insulative tiers and the conductive tiers, thus comprising individual channel-material strings, which is directly electrically coupled with conducting material in the conductor tier. Individual memory cells of the example memory array being formed may comprise a gate region (e.g., a control-gate region) and a memory structure laterally between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally between the channel material and the storage material.

The figures show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18 as shown.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 (operative channel-material string 53) is directly electrically coupled with conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled with conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Example conductive tiers 22 comprise conducting material 48 that is part of individual conductive lines 29 (e.g., wordlines) within individual memory blocks 58. Conducting material 48 may extend laterally across bases of trenches 40 and/or atop uppermost insulative tier 20 (neither being shown). Conductive lines 29 comprise part of elevationally-extending strings 49 of individual transistors and/or memory cells 56. A thin insulative liner (e.g., $Al_2O_3$ and not shown) may be formed before forming conducting material 48.

Approximate locations of some transistors and/or some memory cells 56 are indicated with a bracket or with dashed outlines, with transistors and/or memory cells 56 being essentially ring-like or annular in the depicted example.

Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Conductor material 77 is in and extends elevationally along sidewalls 67 of trenches 40 laterally-over conductive tiers 22 and insulative tiers 20 and directly electrically couples together conducting material 48 of individual conductive tiers 22. In one embodiment, conductor material 77 and conducting material 48 are of the same composition relative one another and in another embodiment are of different compositions relative one another. In one embodiment and as shown, conducting material 48 that is in individual conductive tiers 22 in memory blocks 58 extends laterally-outward of memory blocks 58 into and extends elevationally along sidewalls 67 of trenches 40 laterally-over conductive tiers 22 and insulative tiers 20 and directly electrically couples together conducting material 48 of individual conductive tiers.

Referring to FIGS. 7-9, conductor material 77 (not shown) has been exposed to oxidizing conditions to form an insulative oxide 90 laterally-through conductor material 77 laterally-over individual insulative tiers 22 to separate conducting material 48 of individual conductive tiers 22 from being directly electrically coupled together by conductor material 77. In one embodiment, conductor material 77 comprises conductive metal material and insulative oxide 90 is an insulative metal oxide (comprising the same or different metal[s] in the conductive metal material). Example oxidizing conditions include exposure to $O_2$, $O_3$, and/or $H_2O$ at a temperature of ambient room temperature to 1,000° C., pressure of 1 mTorr to 760 Torr, for from 1 minute to 4 hours.

In one embodiment and as shown, the exposing has formed insulative oxide 90 to extend laterally-into individual conductive tiers 22 in memory blocks 58. Alternately, the exposing may not so form, for example as shown with respect to an alternate construction 10a in FIG. 10-12. Like numerals from the above-described embodiments have been used where appropriate, with some construction differences being indicated with the suffix "a" or with different numerals. For example, and in one embodiment, construction 10a shows the exposing to oxidizing conditions as having formed insulative oxide 90a laterally-over conductive tiers 22 to have laterally-outer sidewalls 91 that are everywhere laterally-coincident with insulative-material sidewalls 67. Any other attribute(s) or aspect(s) as shown and/or described herein with respect to other embodiments may be used.

Figure 18:
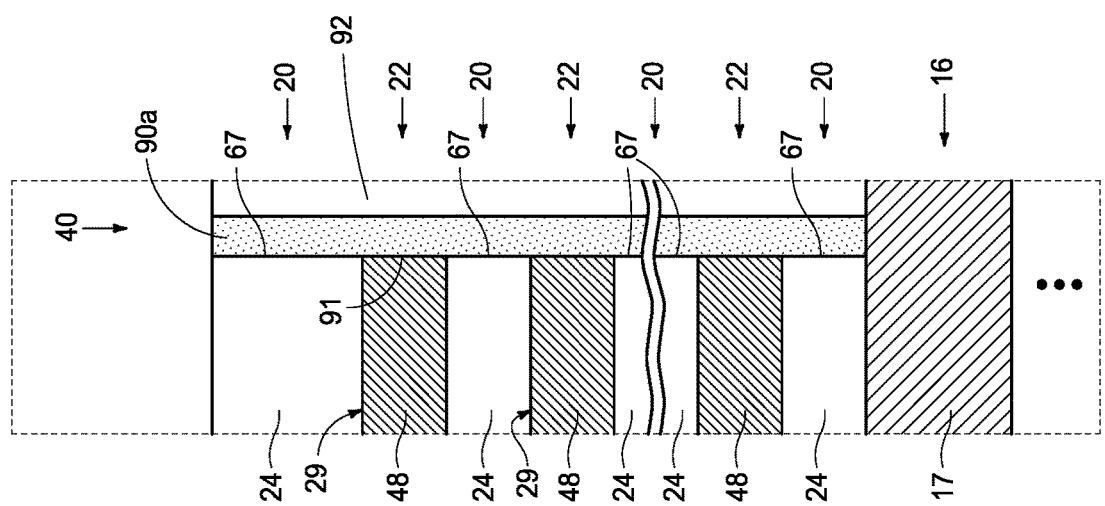

Referring to FIGS. 13-15, and in one embodiment, after forming insulative oxide 90, insulator material 92 has been formed in trenches 40 laterally-inward of insulative oxide 90, and in one such embodiment to fill remaining volume of trenches 40 in construction 10. FIGS. 16-18 shows analogous processing having been conducted for construction 10a. Through-array-vias (TAVs and not shown) may be formed in trenches 40.

All, only some, or none of insulative oxide 90 may remain in a finished circuitry construction comprising the memory array. FIGS. 13-18 show examples where all remains.

Any other attribute(s) or aspect(s) as shown and/or described herein with respect to other embodiments may be used.

Figure 24:
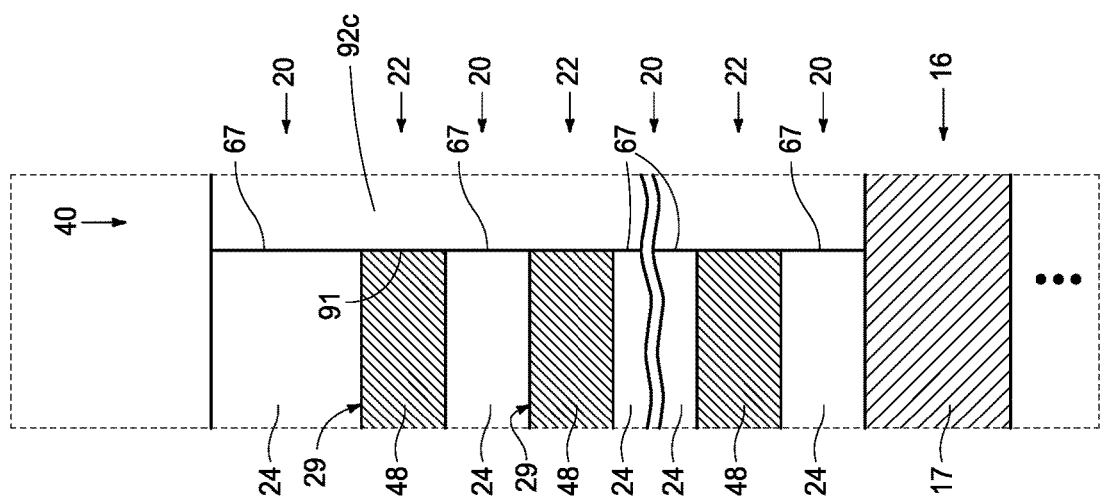

In one embodiment, after forming the insulative oxide, at least some of it is removed and in one embodiment all of it is removed. FIGS. 19-21 show an example alternate embodiment construction 10b corresponding to construction 10 and FIGS. 22-24 show an example alternate embodiment construction 10c corresponding to construction 10a. Like numerals from the above-described embodiments have been used where appropriate, with some construction differences being indicated with the suffixes "b" or "c" respectively, or with different numerals. In such, and by way of example, all of insulative oxide 90 and 90a have been removed (neither thereby being shown) prior to forming insulator material 92b and 92c (e.g., sequentially forming of silicon nitride, silicon dioxide, and polysilicon in one embodiment). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming memory blocks individually comprising a vertical stack comprising alternating insulative tiers and conductive tiers. Channel-material strings extend through the insulative tiers and the conductive tiers. Horizontally-elongated trenches are between immediately-laterally-adjacent of the memory blocks. Conductor material is in and extends elevationally along sidewalls of the trenches laterally-over the conductive tiers and the insulative tiers and directly electrically couples together conducting material of individual of the conductive tiers. The conductor material is exposed to oxidizing conditions to form an insulative oxide laterally-through the conductor material laterally-over individual of the insulative tiers to separate the conducting material of the individual conductive tiers from being directly electrically coupled together by the conductor material.

In some embodiments, a method used in forming a memory array comprising strings of memory cells comprises forming memory blocks individually comprising a vertical stack comprising alternating insulative tiers and conductive tiers. Channel-material strings extend through the insulative tiers and the conductive tiers. Horizontally-elongated trenches are between immediately-laterally-adjacent of the memory blocks. Conducting material that is in individual of the conductive tiers in the memory blocks extends laterally-outward of the memory blocks into and extends elevationally along sidewalls of the trenches laterally-over the conductive tiers and the insulative tiers and directly electrically couples together the conducting material of the individual conductive tiers. The conducting material is exposed to oxidizing conditions to form an insulative oxide laterally-through the conducting material laterally-over individual of the insulative tiers to separate the conducting material of the individual conductive tiers from being directly electrically coupled together. The exposing forms the insulative oxide to extend laterally-into the individual conductive tiers in the memory blocks.

In some embodiments, a method used in forming a memory array comprising strings of memory cells comprises forming memory blocks individually comprising a vertical stack comprising alternating insulative tiers and conductive tiers. Channel-material strings extend through the insulative tiers and the conductive tiers. Horizontally-elongated trenches are between immediately-laterally-adjacent of the memory blocks. Conductor material is in and extends elevationally along sidewalls of the trenches laterally-over the conductive tiers and the insulative tiers and directly electrically couples together conducting material of individual of the conductive tiers. The conductor material is exposed to oxidizing conditions to form an insulative oxide laterally-through the conductor material laterally-over individual of the insulative tiers to separate the conducting material of the individual conductive tiers from being directly electrically coupled together by the conductor material. After forming the insulative oxide, all of it is removed. After all of it is removed, silicon nitride, silicon dioxide, and polysilicon are sequentially formed into the trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
   forming memory blocks individually comprising a vertical stack comprising alternating insulative tiers and conductive tiers, channel-material strings extending through the insulative tiers and the conductive tiers;
   horizontally-elongated trenches between immediately-laterally-adjacent of the memory blocks, conductor material in and extending elevationally along sidewalls of the trenches laterally-over the conductive tiers and the insulative tiers and that directly electrically couples together conducting material of individual of the conductive tiers; and
   exposing the conductor material to oxidizing conditions to form an insulative oxide laterally-through the conductor material laterally-over individual of the insulative tiers to separate the conducting material of the individual conductive tiers from being directly electrically coupled together by the conductor material.

2. The method of claim 1 wherein the conductor material and the conducting material are of the same composition.

3. The method of claim 1 wherein the conductor material comprises conductive metal material and the insulative oxide is an insulative metal oxide.

4. The method of claim 1 comprising, after forming the insulative oxide, forming insulator material in the trenches laterally-inward of the insulative oxide.

5. The method of claim 1 comprising, after forming the insulative oxide, removing at least some of it.

6. The method of claim 5 comprising, after the removing, forming insulator material in the trenches.

7. The method of claim 6 wherein the insulator material is formed to fill remaining volume of the trenches.

8. The method of claim 5 wherein the removing is all of it.

9. The method of claim 8 comprising, after the removing, forming insulator material in the trenches.

10. The method of claim 9 wherein the insulator material is formed to fill remaining volume of the trenches.

11. The method of claim 1 wherein the insulative oxide remains in a finished circuitry construction comprising the memory array.

12. The method of claim 1 wherein the exposing forms the insulative oxide to extend laterally-into the individual conductive tiers in the memory blocks.

13. The method of claim 1 wherein the exposing does not form the insulative oxide to extend laterally-into the individual conductive tiers in the memory blocks.

14. The method of claim 13 wherein the trench sidewalls are defined by sidewalls of insulative material of the insulative tiers in the memory blocks, the exposing forming the insulative oxide laterally-over the conductive tiers to have laterally-outer sidewalls that are everywhere laterally-coincident with the insulative-material sidewalls.

15. A method used in forming a memory array comprising strings of memory cells, comprising:
   forming memory blocks individually comprising a vertical stack comprising alternating insulative tiers and conductive tiers, channel-material strings extending through the insulative tiers and the conductive tiers;
   horizontally-elongated trenches between immediately-laterally-adjacent of the memory blocks, conducting material that is in individual of the conductive tiers in the memory blocks extending laterally-outward of the memory blocks into and extending elevationally along sidewalls of the trenches laterally-over the conductive tiers and the insulative tiers and that directly electrically couples together the conducting material of the individual conductive tiers; and
   exposing the conducting material to oxidizing conditions to form an insulative oxide laterally-through the conducting material laterally-over individual of the insulative tiers to separate the conducting material of the individual conductive tiers from being directly electrically coupled together, the exposing forming the insulative oxide to extend laterally-into the individual conductive tiers in the memory blocks.

16. The method of claim 15 wherein the conducting material comprises conductive metal material and the insulative oxide is an insulative metal oxide.

17. The method of claim 15 comprising, after forming the insulative oxide, forming insulator material in the trenches laterally-inward of the insulative oxide.

18. The method of claim 15 comprising, after forming the insulative oxide, removing at least some of it.

19. The method of claim 18 comprising, after the removing, forming insulator material in the trenches.

20. The method of claim 19 wherein the insulator material is formed to fill remaining volume of the trenches.

21. The method of claim 18 wherein the removing is all of it.

22. The method of claim 21 comprising, after the removing, forming insulator material in the trenches.

23. The method of claim 22 wherein the insulator material is formed to fill remaining volume of the trenches.

24. The method of claim 15 wherein the insulative oxide remains in a finished circuitry construction comprising the memory array.

25. A method used in forming a memory array comprising strings of memory cells, comprising:
   forming memory blocks individually comprising a vertical stack comprising alternating insulative tiers and conductive tiers, channel-material strings extending through the insulative tiers and the conductive tiers;
   horizontally-elongated trenches between immediately-laterally-adjacent of the memory blocks, conductor material in and extending elevationally along sidewalls of the trenches laterally-over the conductive tiers and the insulative tiers and that directly electrically couples together conducting material of individual of the conductive tiers;
   exposing the conductor material to oxidizing conditions to form an insulative oxide laterally-through the conductor material laterally-over individual of the insulative tiers to separate the conducting material of the individual conductive tiers from being directly electrically coupled together by the conductor material;
   after forming the insulative oxide, removing all of it; and
   after the removing, sequentially forming silicon nitride, silicon dioxide, and polysilicon into the trenches.

* * * * *